United States Patent
Yokoyama

(10) Patent No.: US 9,287,678 B2
(45) Date of Patent: Mar. 15, 2016

(54) SEMICONDUCTOR LASER DEVICE AND APPARATUS USING NON-LINEAR OPTICAL EFFECT

(71) Applicant: TOHOKU UNIVERSITY, Sendai-shi, Miyagi (JP)

(72) Inventor: Hiroyuki Yokoyama, Sendai (JP)

(73) Assignee: TOHOKU UNIVERSITY, Sendai-shi (JP)

(*) Notice: Subject to any disclaimer, the term of this patent is extended or adjusted under 35 U.S.C. 154(b) by 0 days.

(21) Appl. No.: 14/341,530

(22) Filed: Jul. 25, 2014

(65) Prior Publication Data
US 2014/0334513 A1 Nov. 13, 2014

Related U.S. Application Data

(63) Continuation of application No. PCT/JP2013/052185, filed on Jan. 31, 2013.

(30) Foreign Application Priority Data

Jan. 31, 2012 (JP) ................................ 2012-018769

(51) Int. Cl.
| | | |
|---|---|---|
| H01S 5/00 | (2006.01) | |
| H01S 5/062 | (2006.01) | |
| G02F 1/35 | (2006.01) | |
| H01S 5/12 | (2006.01) | |

(52) U.S. Cl.
CPC ................ *H01S 5/0078* (2013.01); *G02F 1/35* (2013.01); *H01S 5/06216* (2013.01); *H01S 5/0092* (2013.01); *H01S 5/12* (2013.01)

(58) Field of Classification Search
CPC . H01S 5/005; H01S 5/02248; H01S 5/02284; H01S 5/02288; H01S 5/02292; H01S 5/0267; H01S 5/0687; H01S 5/4012; H01S 3/005; H01S 5/0078; H01S 5/0092; H01S 5/06216; H01S 5/12

USPC ........................................................ 372/50.1
See application file for complete search history.

(56) References Cited

U.S. PATENT DOCUMENTS 7,167,300 B2 * 1/2007 Fermann et al. ........... 359/337.5
7,538,936 B2  5/2009 Yokoyama (Continued)

FOREIGN PATENT DOCUMENTS

| JP | 62-223705 A | 10/1987 |
|---|---|---|
| JP | 4-340921 A | 11/1992 |

(Continued)

OTHER PUBLICATIONS

Basu et al., "Spectral Filtering of Relaxation Oscillations in Injection-Current-Modulated Diode Lasers", OSA Proceedings on Picosecond Electronics and Optoelectronics, Optical Society of America, vol. 4, 1989, pp. 68-72.

(Continued)

*Primary Examiner* — Xinning Niu
*Assistant Examiner* — Vu A Vu
(74) *Attorney, Agent, or Firm* — Westerman, Hattori, Daniels & Adrian, LLP

(57) ABSTRACT

Provided is a semiconductor laser device which can generate an ultra-short pulse light. A semiconductor laser device disclosed herein includes a semiconductor laser unit that performs a gain-switching operation using a relaxation oscillation mechanism to generate a first pulse and a following component of the first pulse, and a filter that processes an output from the semiconductor laser unit by removing a signal in a wavelength bandwidth generated due to at least the following portion in a wavelength bandwidth broadened by chirping. The filter is configured as a short pass filter which passes a short-wavelength component. Further, an apparatus using non-linear optical effect which uses the semiconductor laser device is also provided.

16 Claims, 20 Drawing Sheets

GAIN SWITCHING

(56) References Cited

U.S. PATENT DOCUMENTS

| | | | |
|---|---|---|---|
| 7,606,273 B2* | 10/2009 | Zhu et al. | 372/6 |
| 7,933,304 B2* | 4/2011 | Aoki | 372/96 |
| 8,081,669 B2* | 12/2011 | Yokoyama et al. | 372/25 |
| 2008/0037108 A1 | 2/2008 | Yokoyama | |
| 2010/0110426 A1* | 5/2010 | Cicerone et al. | 356/301 |
| 2010/0188737 A1* | 7/2010 | Terada | 359/359 |
| 2011/0019513 A1* | 1/2011 | Ishimoto et al. | 369/47.5 |

FOREIGN PATENT DOCUMENTS

| | | |
|---|---|---|
| JP | 3669634 B1 | 7/2005 |
| JP | 2008-159729 A | 7/2008 |

OTHER PUBLICATIONS

Dubov et al., "Pulse tail suppression in laser diode output by tunable notch filter", Electronics Letters, vol. 37, No. 23, Nov. 8, 2001, pp. 1404-1405.

Koda et al., "100 W peak-power 1 GHz repetition picoseconds optical pulse generation using blue-violet GaInN diode laser mode-locked oscillator and optical amplifier" Applied Physics Letters, vol. 97, 021101, 2010.

Kono et al., "12 W peak-power 10 ps duration optical pulse generation by gain switching of a single-transverse-mode GaInN blue laser diode", Applied Physics Letters, vol. 93, 131113, 2008.

Nakazawa et al., "Transform-limited pulse generation in the gigahertz region from a gain-switched distributed-feedback laser diode using spectral windowing", Optics Letters, vol. 15, No. 12, Jun. 15, 1990, pp. 715-717.

Niemi et al., "Effect of optical filtering on pulses generated with a gain-switched DFB laser", Optics Communications, vol. 192, Jun. 1, 2001, pp. 339-345.

Yamada et al., "Pulse shaping using spectral filtering in gain-switched quantum well laser diodes", Applied Physics Letters, vol. 63, No. 5, Aug. 2, 1993, pp. 583-585.

Yariv, "Quantum Electronics", John Wiley & Sons, New York, 3rd edition, 1989, pp. 560-565.

International Search Report dated Mar. 19, 2013 issued in corresponding application No. PCT/JP2013/052185.

\* cited by examiner

SEMICONDUCTOR LASER DEVICE AND APPARATUS USING NON-LINEAR OPTICAL EFFECT

CROSS-REFERENCE TO RELATED APPLICATIONS

This application is a continuation application of International Application No. PCT/JP2013/052185, filed on Jan. 31, 2013 and designated the U.S., the entire contents of which are incorporated herein by reference.

FIELD

The present invention relates to a semiconductor laser device, and an apparatus using non-linear optical effect which is provided with the semiconductor laser device as a light source.

BACKGROUND

Making a semiconductor laser output a super-high intensity pulse has come to the fore as an important issue even in a sense of searching new physical phenomenon as well as only the pursuit of extreme performance of the laser (see Non Patent Literatures 1 and 2 below).

As a method of generating a short pulse in the semiconductor laser, as illustrated in FIG. 1, there is a known gain-switching operation using a relaxation oscillation mechanism (see Non Patent Literature 3 below).

As an application of such a technology, there is a technology of shortening the pulse width of an optical pulse. In this technology, when a laser diode (hereinafter, referred to as LD) generates an optical pulse in a bandwidth broadened by chirping, a signal in a bandwidth narrower than the width broadened by the chirping is extracted from optical spectra of the optical pulse generated by the laser diode (see Patent Literature 1 below).

In such a technology, a band pass filter is used only for the purpose of extracting a component of the optical pulse in the narrower bandwidth from the optical spectra broadened by the chirping.

Further, there is a technology in which, after being compressed by a pulse compressor in compensation with down chirping, an optical pulse from a single longitudinal mode semiconductor laser is amplified by an amplifier, subjected to a process of removing noises due to spontaneous emission light included in the pulse compressed by a waveform shaper and a pedestal component, and further amplified by another amplifier to gain short pulse light (see Patent Literature 2 below).

CITATION LIST

Patent Literature

Patent Literature 1: JP 3669634 B1
Patent Literature 2: JP 2008-159729 A

Non Patent Literature

Non Patent Literature 1: S. Kono et al., Appl. Phys. Lett. 93, 131113 (2008).
Non Patent Literature 2: R. Koda et al., Appl. Phys. Lett. 97, 021101 (2010).
Non Patent Literature 3: A. Yariv, "Quantum Electronics" 'Wiley, New York, 1989, pp.560-565.

In the technology described in Patent Literature 1, a time waveform of the optical pulse generated from the LD includes only a first pulse 40 as illustrated in FIG. 2, and oscillation spectra 41 in a bandwidth broadened by the chirping as described above are generated due to the first pulse 40 (see FIG. 3). In addition, FIG. 2 is a diagram illustrating an example of the time waveform of the optical pulse in the related art, and FIG. 3 is a diagram illustrating an example of the optical spectra of the pulse.

Further, in the technology, a pulse generator is required a sever performance in order to generate an electric pulse with a pulse width of about 100 picosecond or less. Furthermore, there is a need to make fine adjustment on the pulse generator for exhibiting such a performance.

Further, in the technology described in Patent Literature 2, a pulse compressor is necessary in order to compress an optical pulse from the single longitudinal mode semiconductor laser for making the chirping of the optical pulse compensated. Therefore, the number of components increases and, as a result, the total cost of the apparatus rises.

SUMMARY

Technical Problems

The invention has been finalized in view of the above problems, and an object of the invention is to provide a semiconductor laser device which can easily and reliably generate a desired ultra-short pulse light by a simple and easily maintainable configuration, and an apparatus using non-linear optical effect which includes the semiconductor laser device as a light source.

In addition, still another object of the invention is to obtain operational advantages which are not obtained in the technologies of the related art and result from each configuration suggested in the following embodiments.

Solution to Problem

The semiconductor laser device includes a semiconductor laser unit that performs a gain-switching operation using a relaxation oscillation mechanism to generate an optical pulse signal which includes a first pulse and a following component of the first pulse, and a filter that processes an output from the semiconductor laser unit by removing a signal in a wavelength bandwidth generated due to at least the following portion in a wavelength bandwidth broadened by chirping, and extracting a component caused by the first pulse to obtain an ultra-short pulse. The filter is configured as a short pass filter which includes an edge filter and passes a short-wavelength component.

The semiconductor laser unit may be formed by a single longitudinal mode oscillation semiconductor laser.

The semiconductor laser unit may be formed by a distributed-feedback semiconductor laser.

The semiconductor laser device may be configured such that when the short pass filter passes the short-wavelength component, the short pass filter removes a long-wavelength side component in the wavelength bandwidth broadened by the chirping which is caused by a portion including the following component and a part of the first pulse, and a long-wavelength side of a skirt portion in a short-wavelength side component.

In addition, in the semiconductor laser device, the semiconductor laser unit may be configured to include the semiconductor laser and an excitation pulse generator which generates an excitation pulse with duration from sub-nanosecond to nanosecond to drive the semiconductor laser, the semiconductor laser unit may be configured to perform the gain-switching operation using the relaxation oscillation mechanism to generate the optical pulse signal which includes the first pulse and the following component of the first pulse, and the short pass filter may remove a signal in a wavelength bandwidth generated due to at least the following portion and extracts a component caused by the first pulse to obtain an ultra-short pulse with picosecond duration.

In the semiconductor laser device, the short pass filter may be configured by a dielectric multilayer film filter as the edge filter.

In the semiconductor laser device, the dielectric multilayer film filter may have dependency on a wavelength in use due to a steep cutoff characteristic.

In the semiconductor laser device, there may be provided a temperature control device that performs temperature adjustment to control oscillation in the wavelength which is output from the semiconductor laser unit.

In the semiconductor laser device, an optical amplifier may be provided on either one or both of input and output sides of the filter.

Furthermore, the apparatus using non-linear optical effect includes the semiconductor laser device as a light source, and uses non-linear optical effect by an optical signal from the light source.

The apparatus using non-linear optical effect may be a laser microscope which uses the semiconductor laser device as the light source.

The apparatus using non-linear optical effect may be a laser beam machining apparatus which uses the semiconductor laser device as the light source.

The apparatus using non-linear optical effect may be a non-linear wavelength conversion apparatus which uses the semiconductor laser device as the light source.

The apparatus using non-linear optical effect may be a harmonic light generation apparatus which uses the semiconductor laser device as the light source.

The apparatus using non-linear optical effect may be a sum frequency light generation apparatus which uses the semiconductor laser device as the light source.

The apparatus using non-linear optical effect may be a difference frequency light generation apparatus which uses the semiconductor laser device as the light source.

ADVANTAGEOUS EFFECTS

According to the disclosed technology, a semiconductor laser unit is configured to include a semiconductor laser unit which generates an optical pulse signal including a first pulse and a following component of the first pulse. Alternatively, the semiconductor laser unit is configured to include a distributed-feedback semiconductor laser or a single longitudinal mode oscillation semiconductor laser. Therefore, the first pulse and the following component of the first pulse are generated separately from each other in time, and a signal in a wavelength bandwidth generated due to at least the following portion in a wavelength bandwidth broadened by the chirping is removed by a filter which includes an edge filter and is configured as a short pass filter which passes the short-wavelength component. Thus, the component caused by the first pulse can be extracted by a simple configuration so as to easily and reliably obtain a desired extremely-short optical pulse (the extremely-short optical pulse has the same meaning as the ultra-short pulse, and the same shall apply hereafter). Furthermore, since there is no need to provide an additional component such as a pulse compressor for compressing a pulse, the configuration can be simplified and the number of components is reduced, so that it is possible to achieve the cost down of the apparatus.

According to the disclosed technology, since the short pass filter passes the short-wavelength component, a component caused by the first pulse can be extracted by a simple configuration to easily and reliably obtain a desired ultra-short pulse.

According to the disclosed technology, since a semiconductor laser and an excitation pulse generator which generates an excitation pulse with duration from sub-nanosecond to nanosecond to drive the semiconductor laser are provided, a picosecond extremely-short optical pulse can be easily and reliably obtained using a typical excitation pulse generator which is inexpensive and easily maintainable.

According to the disclosed technology, since the short pass filter is configured by a dielectric multilayer film filter as the edge filter, the dielectric multilayer film filter can change an edge wavelength by an incident angle using a several-mm square size element. Therefore, it is possible to highly miniaturize the apparatus as well as the function.

According to the disclosed technology, since the dielectric multilayer film filter has dependency on a wavelength in use due to a steep cutoff characteristic, the ultra-short pulse can be achieved.

According to the invention, since a temperature control device which performs temperature adjustment to control oscillation in the wavelength which is output from the semiconductor laser unit, a desired wavelength can be obtained.

According to the disclosed technology, since the optical amplifier is provided on either one or both of input and output sides of the filter, it is possible to achieve a very ultra-short pulse.

Further, since also various apparatuses using non-linear optical effect are provided using the semiconductor laser device as a light source, it contributes to a reduction in cost for manufacturing various apparatuses using non-linear optical effect.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments of the invention will be described with reference to the drawings.

[A. Principle and Configuration]

First, a principle of the invention and a configuration according to an embodiment of the invention will be described.

Figure 1:
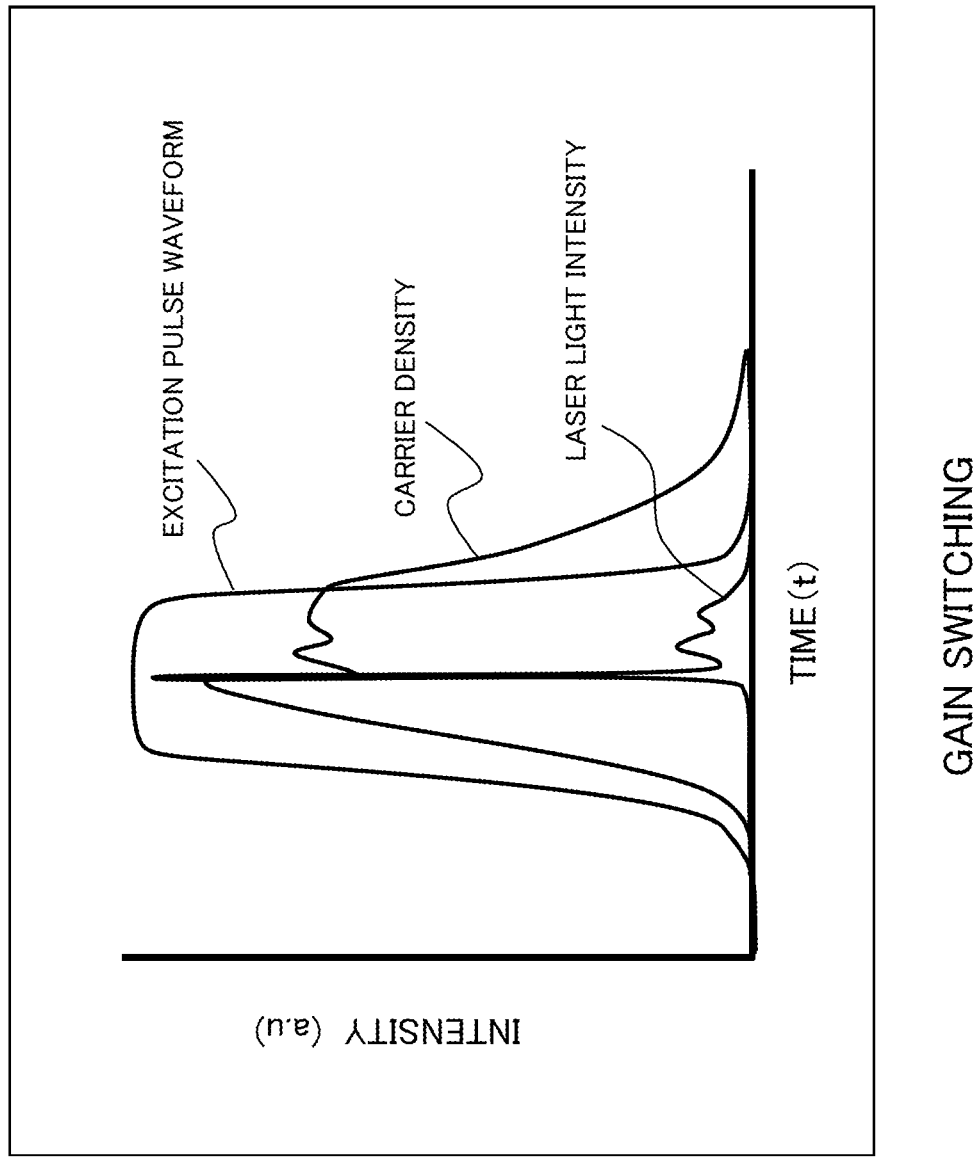
FIG. 1 is a graph illustrating an example of a gain-switching operation in which a relaxation oscillation mechanism is used.
Figure 2:
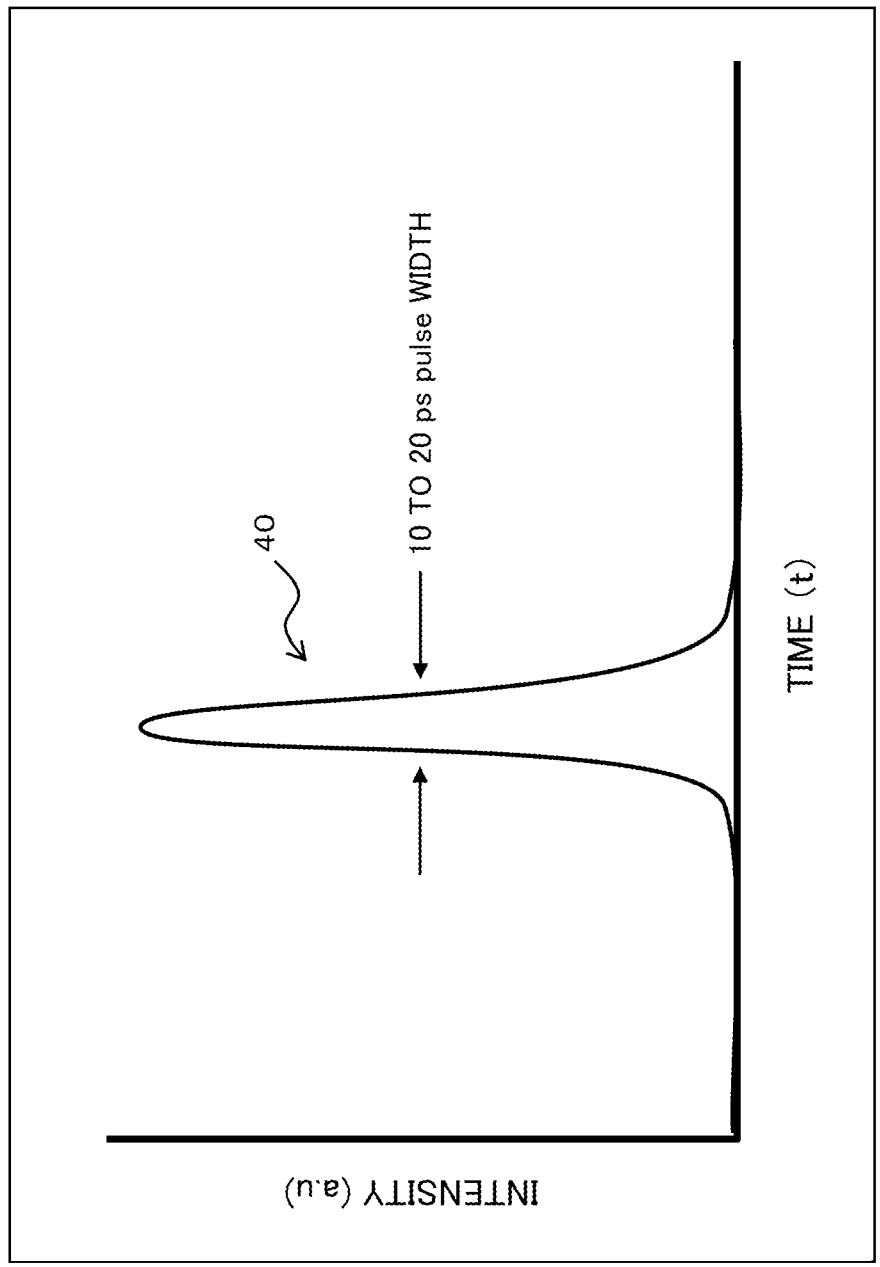
FIG. 2 is a diagram illustrating an example of a time waveform of an optical pulse from a semiconductor laser by pulse excitation with about 100 picosecond duration.
Figure 3:
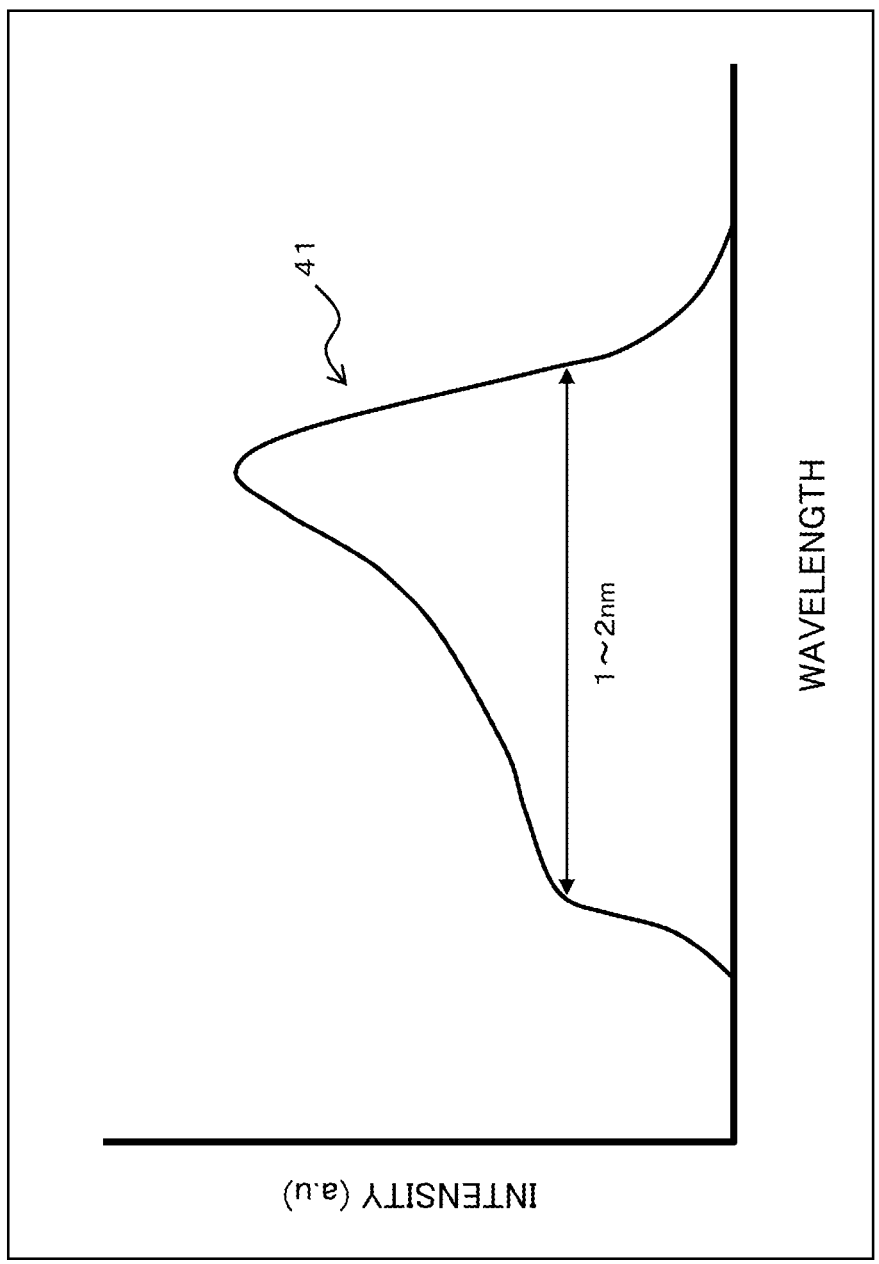
FIG. 3 is a diagram illustrating an example of chirping in an optical pulse from the semiconductor laser by pulse excitation with about 100 picosecond duration.
Figure 4:
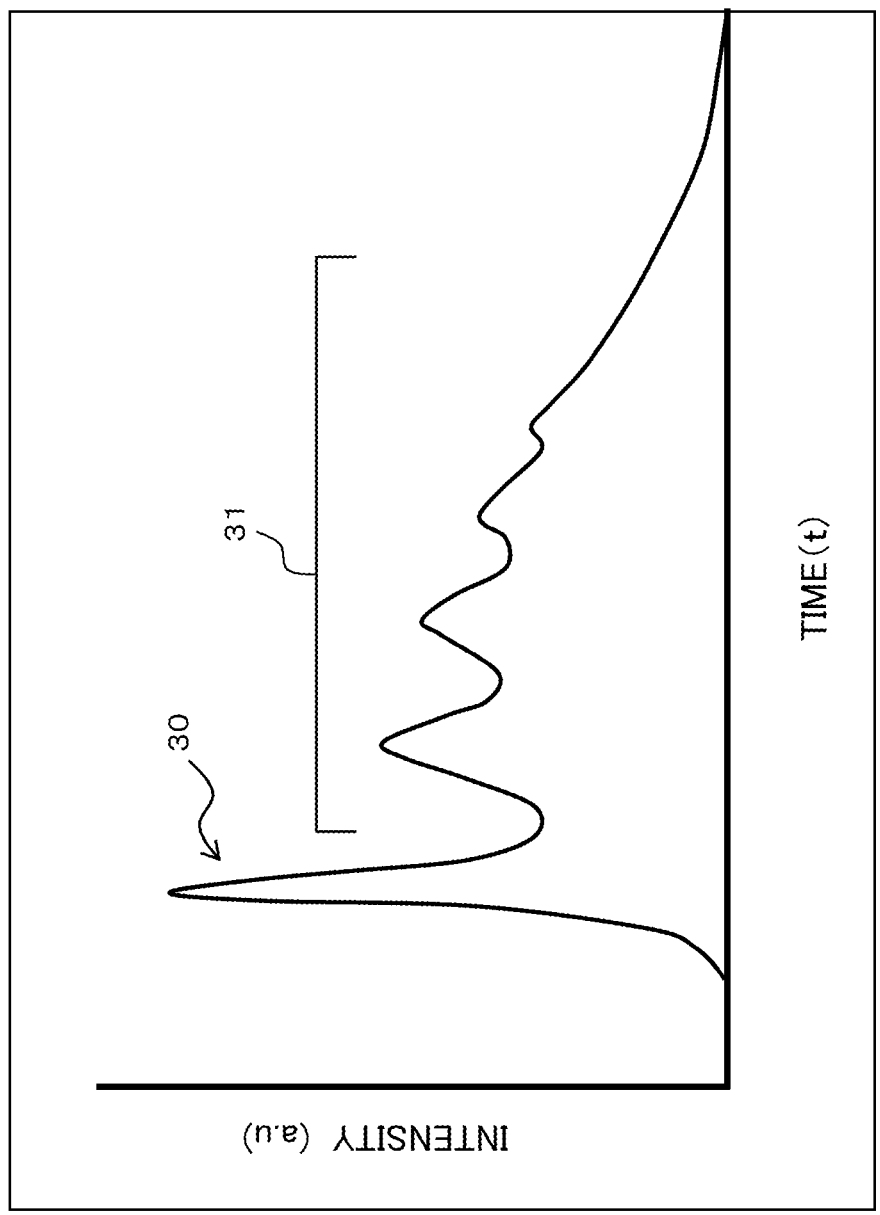
FIG. 4 is a diagram illustrating an example of a time waveform of an optical pulse from the semiconductor laser by pulse excitation with about sub-nanosecond duration.

In a semiconductor laser which performs a gain-switching operation using a relaxation oscillation mechanism caused by pulse excitation, depending on the specification, for example, a first pulse 30 and a following component 31 of the first pulse 30 forming single longitudinal mode oscillation are generated in the time waveform as illustrated in FIG. 4.

Figure 5:
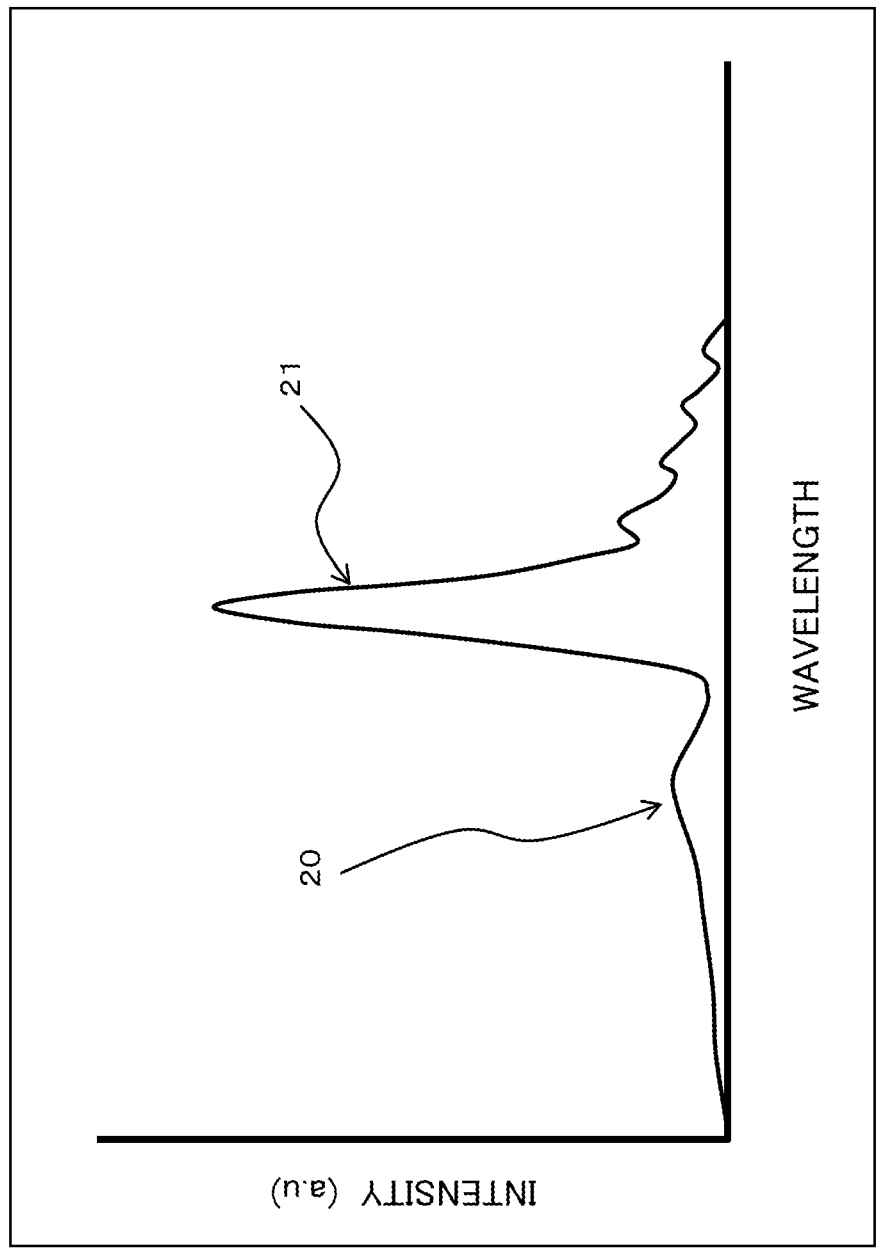
FIG. 5 is a diagram illustrating optical spectra of an optical pulse from the semiconductor laser by pulse excitation with about sub-nanosecond duration.

In such a type of semiconductor laser, for example, oscillating spectra of a pulse width broadened by chirping are generated as illustrated in FIG. 5. However, in this case, a time-dependent frequency shift occurs in the oscillation spectra at the time of gain-switching oscillation, and the generated optical signal includes a component 20 having a short wavelength (a short-wavelength bandwidth component; a high-frequency component) and a component 21 having a long wavelength (a long-wavelength bandwidth component; a low-frequency component).

Figure 6:
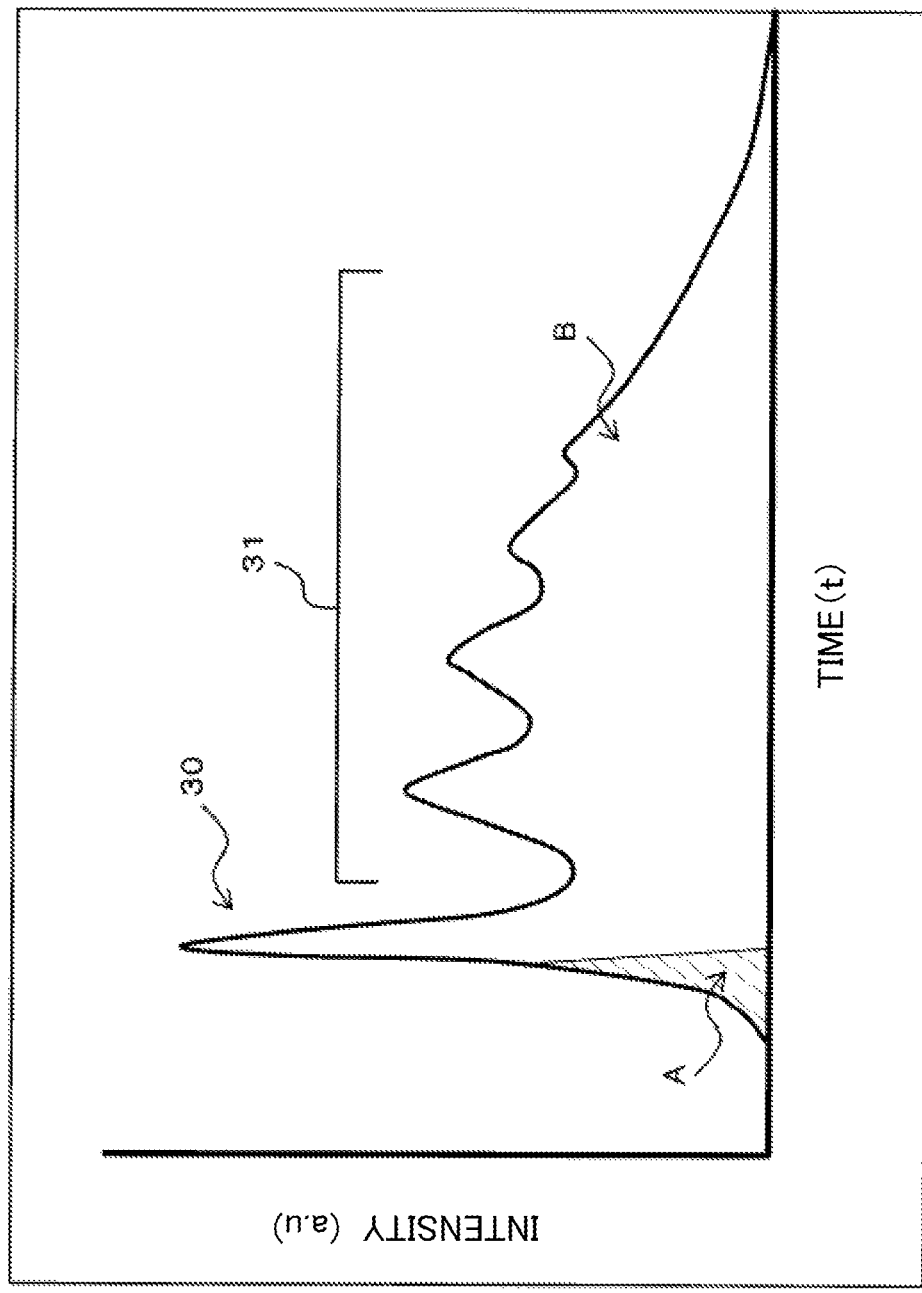
FIG. 6 is a diagram for describing an extracting portion of a first pulse from single longitudinal mode oscillation after passing through a short pass filter in FIG. 4.

In the semiconductor laser (hereinafter, the semiconductor laser may be referred to as a "gain-switching semiconductor laser") which generates the first pulse 30 and the following component 31 thereof by the gain-switching operation using the relaxation oscillation mechanism, the invention provides a semiconductor laser device which is configured to obtain a pulse signal caused by the first pulse 30 by removing the long-wavelength side signal 21 (FIG. 5) caused by at least the following portion in the wavelength bandwidth broadened by the chirping using a filter configured as a short pass filter which passes the short-wavelength component. FIG. 6 illustrates the above configuration in which portion B without hatching in FIG. 6 is removed and portion A with hatching in FIG. 6 is extracted for use. Herein, the expression "at least the following portion" means a portion including the following component 31 and a part of the first pulse 30. Further, an apparatus using non-linear optical effect is also provided in which the semiconductor laser device is used as a light source.

Figure 7:
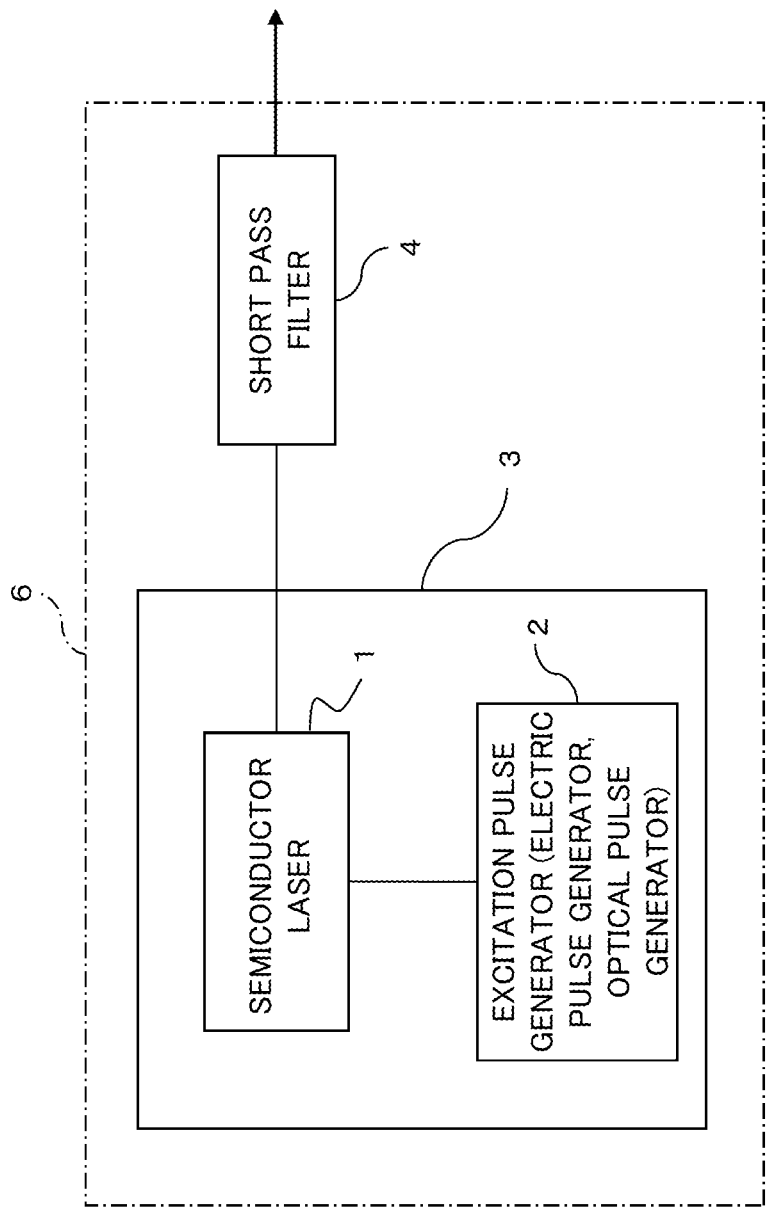
FIG. 7 is a diagram schematically illustrating a configuration of a semiconductor laser device according to an embodiment of the invention.

FIG. 7 is a diagram schematically illustrating a configuration of a semiconductor laser device 6 according to an embodiment of the invention.

The semiconductor laser device 6 includes a semiconductor laser unit 3, which includes a semiconductor laser 1 and an excitation pulse generator 2, and a short pass filter 4.

In the semiconductor laser device 6, the specification of the semiconductor laser 1 and the specification of the excitation pulse generator 2 are appropriately combined in the semiconductor laser unit 3 so as to generate the first pulse 30 and the following component 31 of the first pulse 30 which are separated from each other in the time domain by the gain-switching operation (see FIG. 4).

As the excitation pulse generator 2, an electric pulse generator or an optical pulse generator is used which generates an electric pulse or an optical pulse and applies the electric pulse or the optical pulse to the semiconductor laser 1. The excitation pulse generator 2, for example, is a generator which generates a 600-ps electric pulse at −5 V. The excitation pulse generator 2 generates an electric pulse with duration from sub-nanosecond to nanosecond, and is relatively inexpensive and easily maintainable. For example, the excitation pulse generator 2 is an electric pulse generator which is inexpensive by about 1 digit compared to a 100-ps electric pulse generator in the related art. Further, the excitation pulse generator 2 may be an optical pulse generator which generates the optical pulse on the same level as that of the electric pulse generator as described above.

The semiconductor laser 1 is a laser which performs the gain-switching oscillation, for example, a 1.55-μm distributed-feedback (DFB) laser diode. While not illustrated in the drawing, the semiconductor laser unit 3 may perform temperature adjustment to be in an appropriate temperature (for example, 25° C.) using a temperature control device for wavelength control.

When being combined with the excitation pulse generator 2 having an appropriate specification as described above, the semiconductor laser 1 causes a time-dependent frequency shift in the oscillation spectra at the time of oscillation. At this time, the pulse generated from the semiconductor laser unit 3, for example, includes the steep and short first pulse 30 and the wide and smooth following component 31 which follows the first pulse 30 in the time domain, and these are separated in time as illustrated in FIG. 4. The generated pulse, for example, as illustrated in FIG. 5, a component 20 in a short wavelength bandwidth (a short-wavelength bandwidth component; a high frequency component) and a component 21 broadened toward a long wavelength caused by at least the following portion which includes the following component 31 of FIG. 4 and a part of the first pulse 30 of FIG. 4 (a long-wavelength bandwidth component; a low frequency component).

In addition, the description will be made using a distributed-feedback laser diode herein, but the invention is not limited to the distributed-feedback laser diode. Further, a distributed Bragg reflector semiconductor laser diode, a vertical resonator surface light emitting laser, and the like may be used as long as a semiconductor laser diode generates the single longitudinal mode oscillation.

The short pass filter 4, for example, is a short pass filter which removes a signal in a wavelength bandwidth generated due to at least the following portion in the wavelength bandwidth broadened by the chirping. Herein, the expression "at least the following portion" means a portion including the following component 31 and a part of the first pulse 30. The short pass filter 4, for example, is configured as a short pass filter which passes a short-wavelength component. The short pass filter 4, for example, includes a dielectric multilayer film composed of about 10 layers, but may be formed by a dielectric multilayer film composed of more layers from 10 to 100, and further layers more than 100. A filter made by layering a number of dielectric multilayer films may be called an edge filter which has a steep cutoff characteristic. In the example, when a wavelength λ is 1.55 μm, the edge filter in use is desirable to have a steep cutoff characteristic in which a width is about 1 nm when a transmittance T falls from 0.9 to 0.1. In addition, when the wavelength λ is shorter than 1.55 μm, the edge filter is necessary to have a cutoff characteristic in which a width is smaller than 1 nm when the transmittance T falls from 0.9 to 0.1. For example, when the wavelength λ is 0.8 μm, the edge filter is necessary to have a steep cutoff characteristic in which a width is about in a range about 0.2 nm to 0.3 nm when the transmittance T falls from 0.9 to 0.1. In other words, the steep cutoff characteristic of the edge filter depends on a wavelength in use, and the width when the transmittance T falls from 0.9 to 0.1 is necessarily narrowed as the wavelength is shortened. By making a pulse generated from the semiconductor laser 1 pass through the short pass filter 4, the long-wavelength bandwidth component 21 (FIG. 5) generated due to at least the following portion in the wavelength bandwidth broadened by the chirping is removed, and the component 20 caused by the first pulse 30 is extracted, thereby achieving an ultra-short pulse.

In other words, by using the distributed-feedback laser diode, there occurs single longitudinal mode oscillation which is generated from the distributed-feedback laser diode. When the chirping is caused in the single longitudinal mode oscillation, the first pulse 30 and the following component 31 of the first pulse included in the single longitudinal mode oscillation are generated. The following component 31 (Area B of FIG. 6) of at least the first pulse is removed from one pulse light (Areas A and B of FIG. 6) by making these pulses pass through the short pass filter, and the component of Area A with hatching in FIG. 6 which is a part of the first pulse 30 is extracted. Therefore, the short-wavelength bandwidth component 20 of a signal output from the semiconductor laser 1 is removed by making the generated pulse in the single longitudinal mode illustrated in FIG. 4 pass through the short pass filter 4, and Area A illustrated with hatching in FIG. 6 is extracted, so that it is possible to achieve a shorter pulse (the ultra-short pulse).

In addition, for example, an optical amplifier (not illustrated) such as an erbium-doped fiber amplifier (EDFA) may be provided at the front stage and/or the rear stage of the short pass filter 4. Further, for example, in a case where pulses of a 100-MHz repetition frequency are applied, the optical amplifier described above may not be provided.

[B. Operations]

Next, the operations of the semiconductor laser device 6 will be described.

Figure 8:
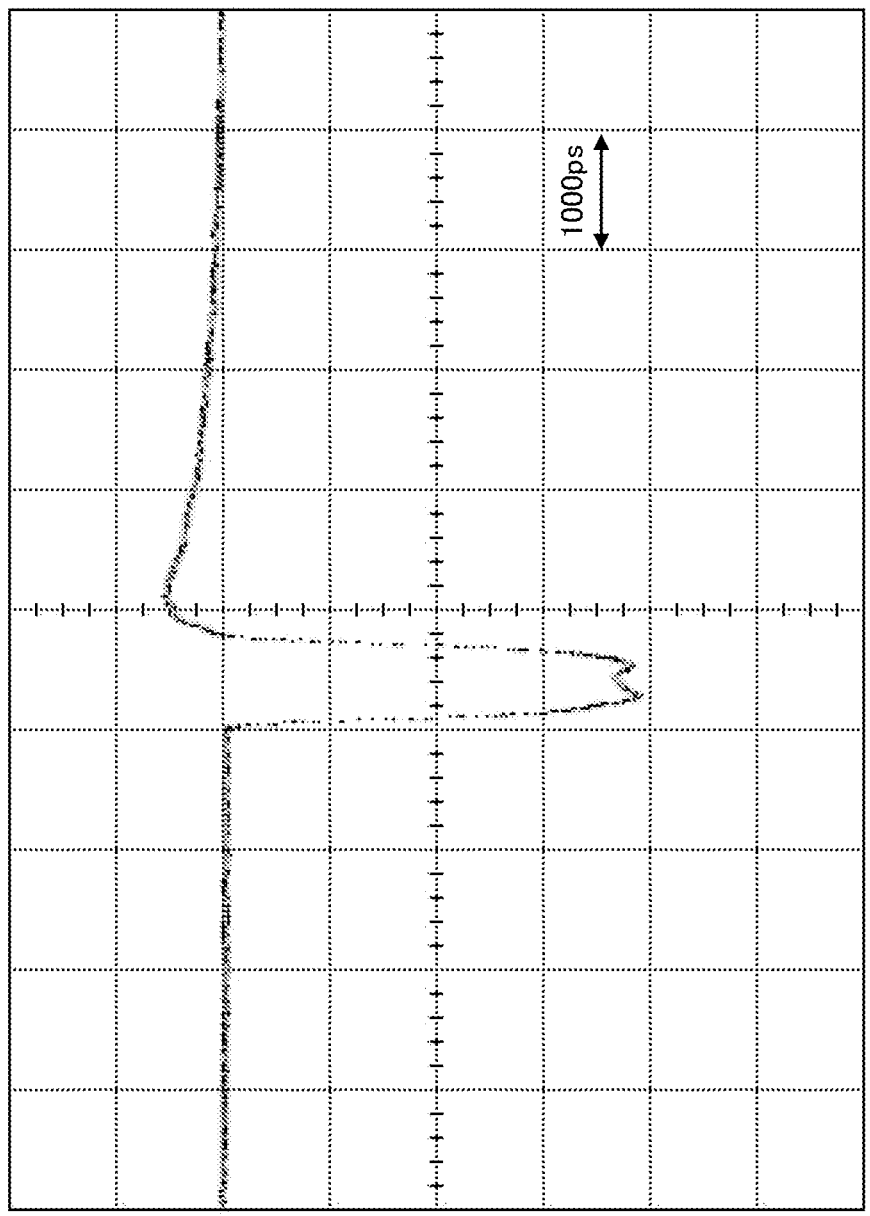
FIG. 8 is a diagram illustrating an example of a voltage pulse waveform which is applied from an excitation pulse generator to the semiconductor laser according to an embodiment of the invention.

FIG. 8 is a diagram illustrating an example of a voltage pulse waveform which is applied from an excitation pulse generator 2 to the semiconductor laser 1 according to an embodiment of the invention. The waveform, for example, is a waveform measured after a fixed 3-dB attenuation using a 20-dB attenuator (ATT) for measurement.

Figure 9:
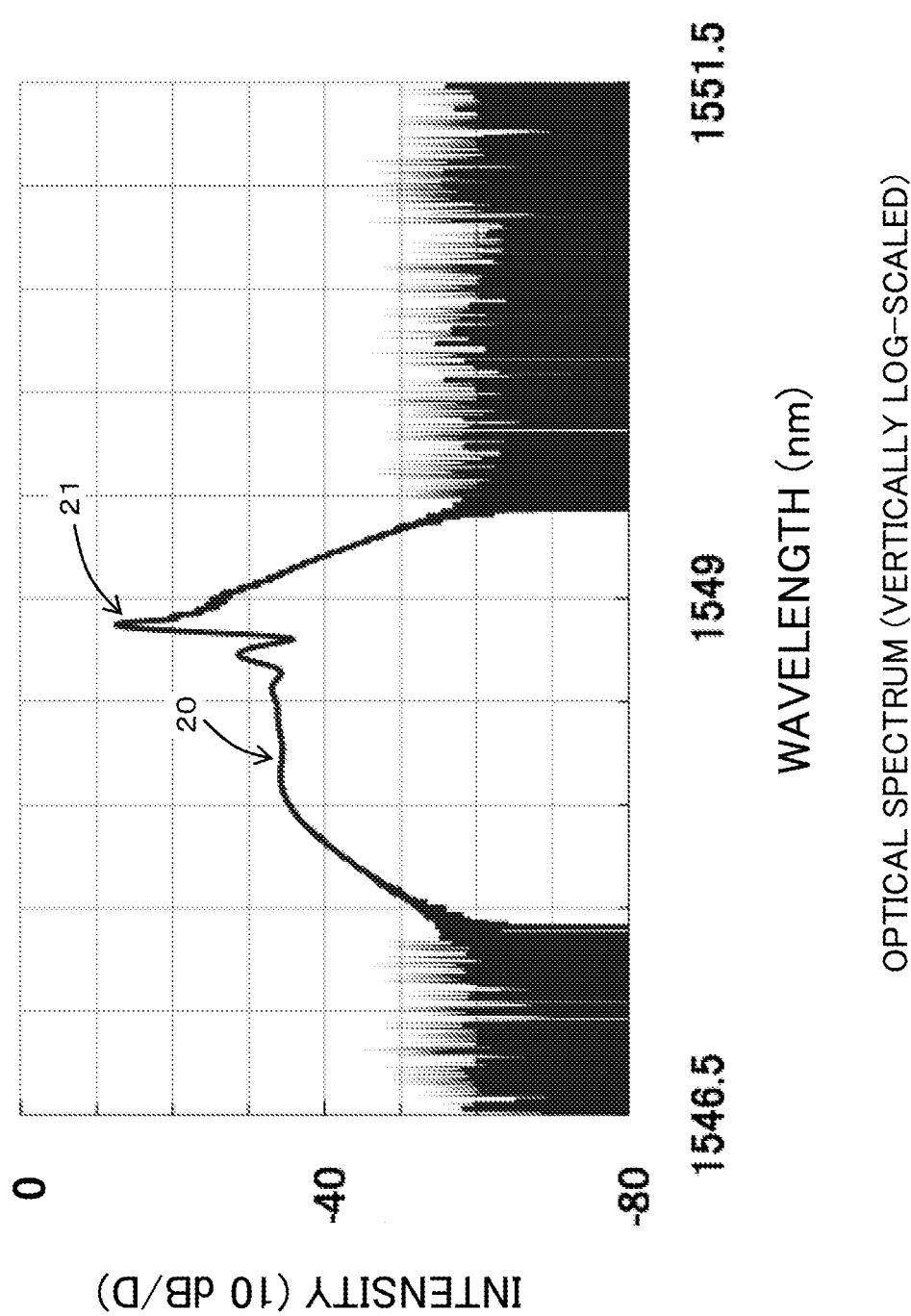
FIG. 9 is a diagram illustrating an example of vertically log-scaled spectra of the optical pulse output from the semiconductor laser to which the voltage pulse of FIG. 8 is applied, according to an embodiment of the invention.

FIG. 9 illustrates an example of vertically log-scaled spectra of the optical pulses output from the semiconductor laser unit 3 by the excitation of the electric pulse. As illustrated in FIG. 9, the optical pulse includes the short-wavelength bandwidth component 20 and the long-wavelength bandwidth component 21.

Figure 10:
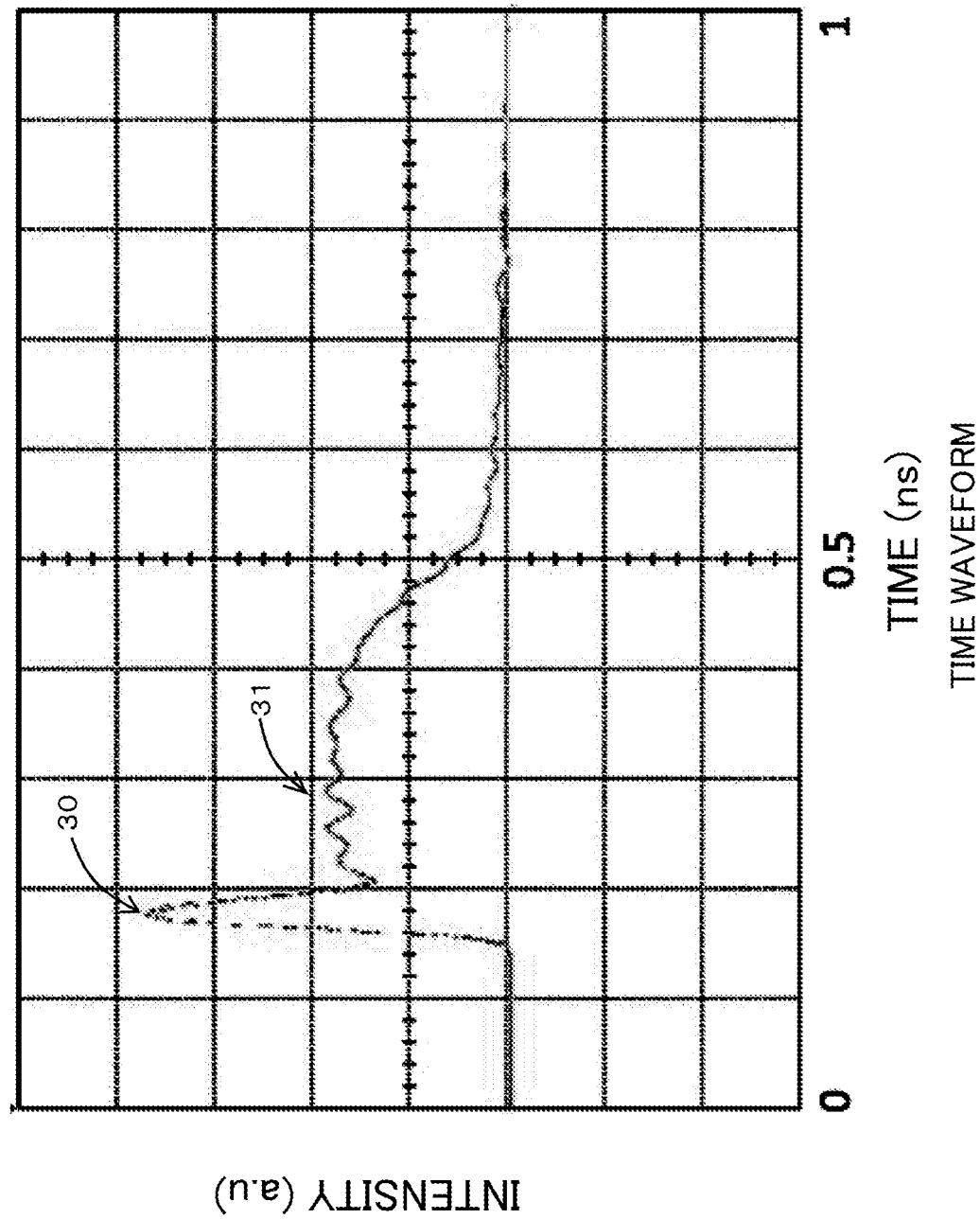
FIG. 10 is a diagram illustrating an example of a time waveform of the optical pulse output from the semiconductor laser to which the voltage pulse of FIG. 8 is applied, according to an embodiment of the invention.

FIG. 10 is a diagram illustrating an example of a time waveform (oscilloscope observation) of the optical pulse output from the semiconductor laser unit 3. As illustrated in FIG. 10, the optical pulse output from the semiconductor laser unit 3 includes the first pulse 30 and the following component 31 which follows the first pulse 30, and these pulses are separated in time.

The short-wavelength bandwidth component 20 illustrated in FIG. 9 is caused by the first pulse 30 of FIG. 10, and the long-wavelength bandwidth component 21 illustrated in FIG. 9 is caused by the following component 31.

In this way, the optical spectra of the laser pulse are broadened by about 1 nm in this example. Such a phenomenon is called chirping.

In the invention, the short pass filter 4 illustrated in FIG. 7 is used in order to obtain an ultra-short pulse by removing at least the following portion in the wavelength bandwidth broadened by the chirping and by extracting only the first pulse 30.

Figure 11:
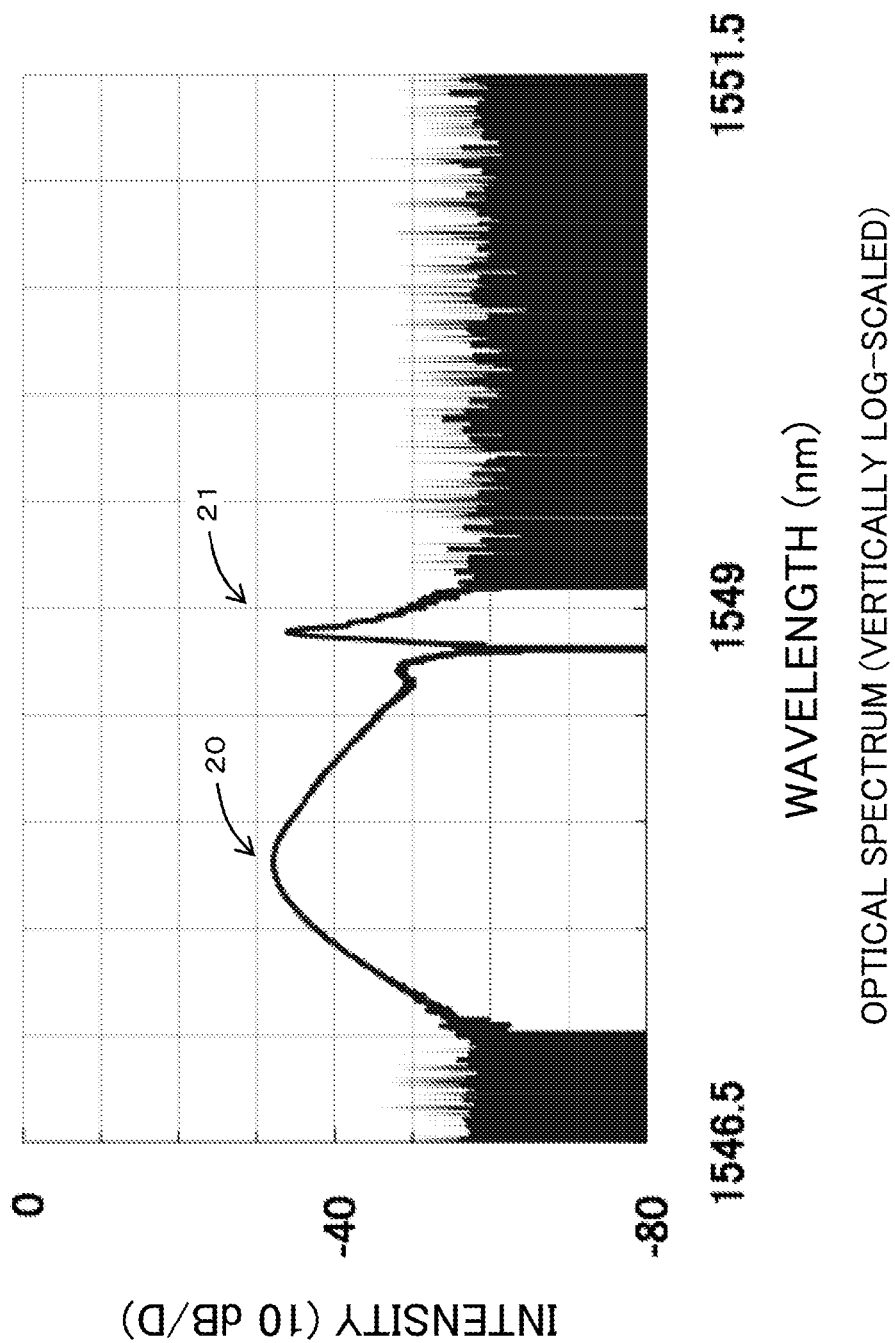
FIG. 11 is a diagram illustrating an example of vertically log-scaled spectra of the optical pulse after passing through the short pass filter, according to an embodiment of the invention.

FIG. 11 is a diagram illustrating an example of vertically log-scaled spectra (oscilloscope observation) of the optical pulse after passing through the short pass filter 4, according to an embodiment of the invention. As described above, the short pass filter 4 is a short pass filter which removes the long-wavelength bandwidth component 21. In detail, as described above, the short pass filter 4, for example, is configured as a short pass filter which passes the short-wavelength component.

In FIG. 11, the short-wavelength bandwidth component 20 is almost not changed compared to the spectra of the optical pulse before passing through the short pass filter 4 illustrated in FIG. 9, but the long-wavelength bandwidth component 21 is substantially attenuated.

Figure 12:
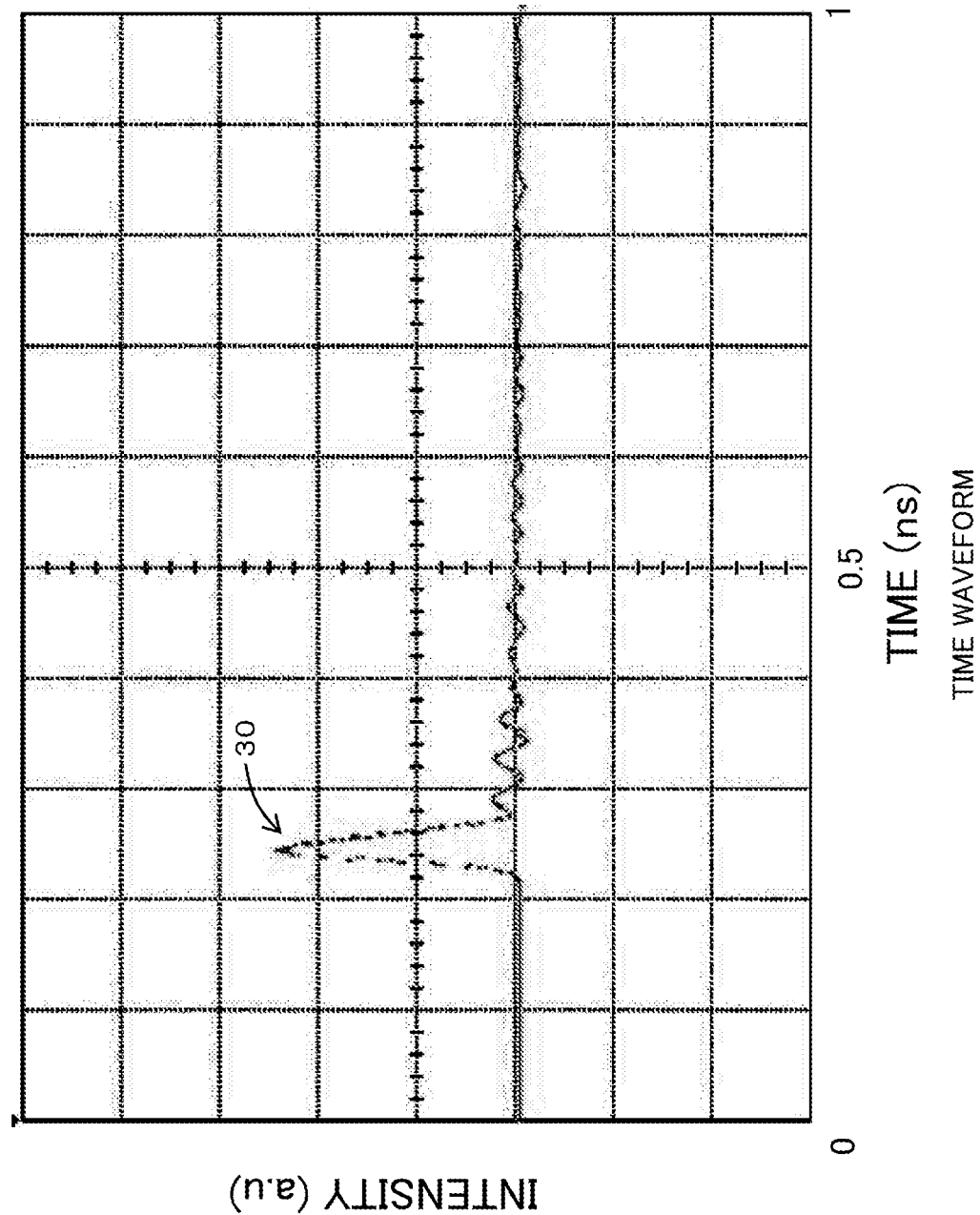
FIG. 12 is a diagram illustrating an example of a time waveform of the optical pulse after passing through the short pass filter, according to an embodiment of the invention.

FIG. 12 is a diagram illustrating an example of a time waveform (oscilloscope observation) of the optical pulse after passing through the short pass filter 4.

In FIG. 12, the following component 31 of the first pulse 30 is completely removed compared to the time waveform of the optical pulse before passing through the short pass filter 4 illustrated in FIG. 10, and only the first pulse 30 is extracted. In addition, in FIG. 12, ringing after the main pulse 30 is related to an electrical response, but not the optical signal.

An accurate pulse width of the optical pulse which is obtained in the semiconductor laser device 6 can be obtained by intensity autocorrelation measurement.

Figure 13:
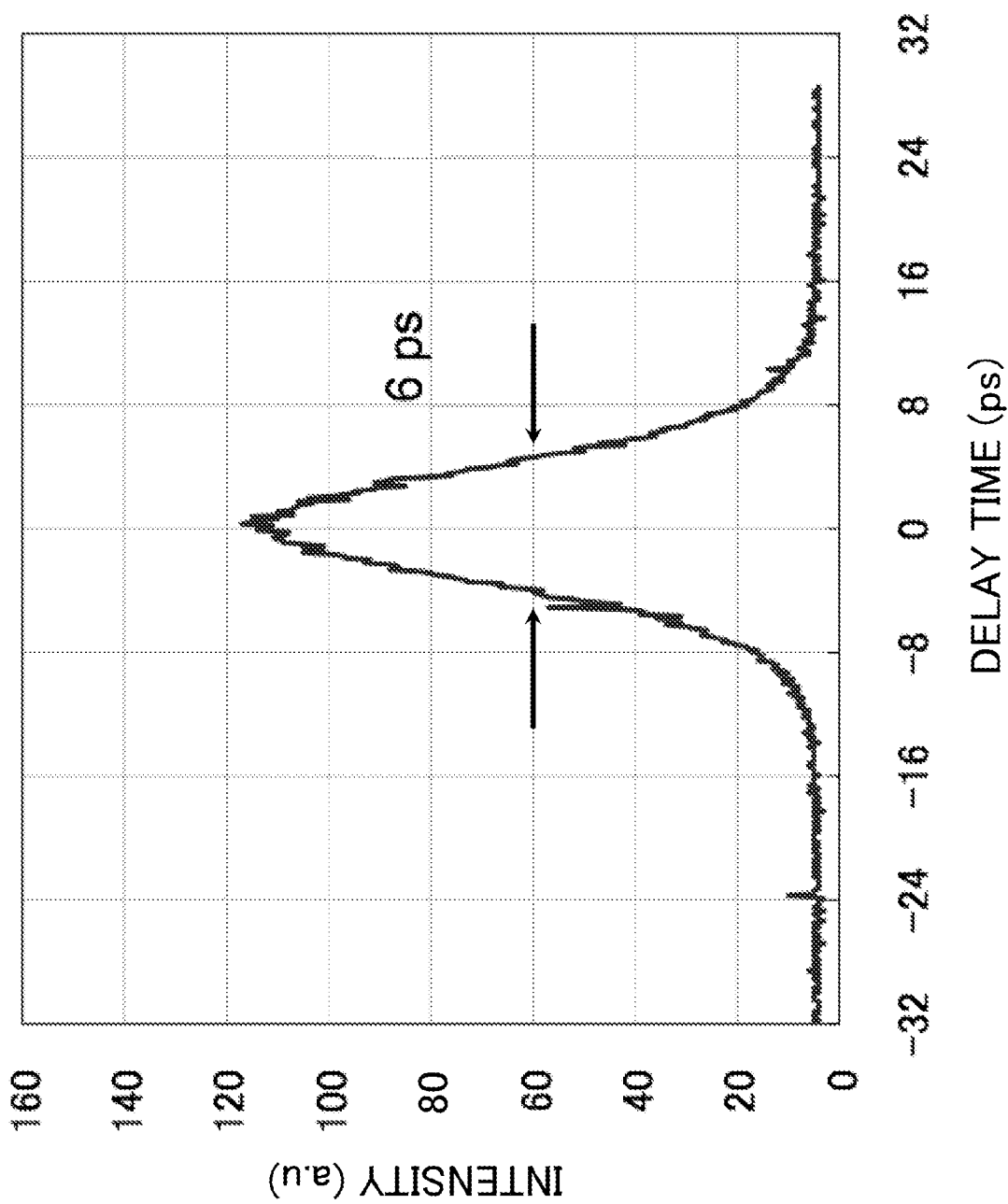
FIG. 13 is a diagram illustrating an example of a result of intensity autocorrelation measurement of the optical pulse obtained in a semiconductor laser device according to an embodiment of the invention.

FIG. 13 illustrates an example of a result of intensity autocorrelation measurement of the optical pulse obtained in a semiconductor laser device 6 according to an embodiment of the invention. In this example, the pulse width of the optical pulse is fixed to 6 ps.

As described above, according to an embodiment of the invention, since the excitation pulse generator 2 which is inexpensive and easily maintainable is used, it is possible to provide the semiconductor laser device 6 which easily and reliably generates a desired ultra-short pulse light with a simple configuration. Furthermore, since there is no need to provide an additional component such as a pulse compressor for compressing a pulse, the configuration can be simplified and the number of components is reduced, so that it is possible to achieve the cost down of the apparatus.

[C. Apparatus Using Non-Linear Optical Effect]

The semiconductor laser device 6 can be used as a light source of various types of apparatuses using non-linear effect, such as a laser microscope, a laser beam machining apparatus, a non-linear wavelength conversion apparatus, a harmonic light generation apparatus, a sum frequency light generation apparatus, and a difference frequency light generation apparatus.

Figure 14:
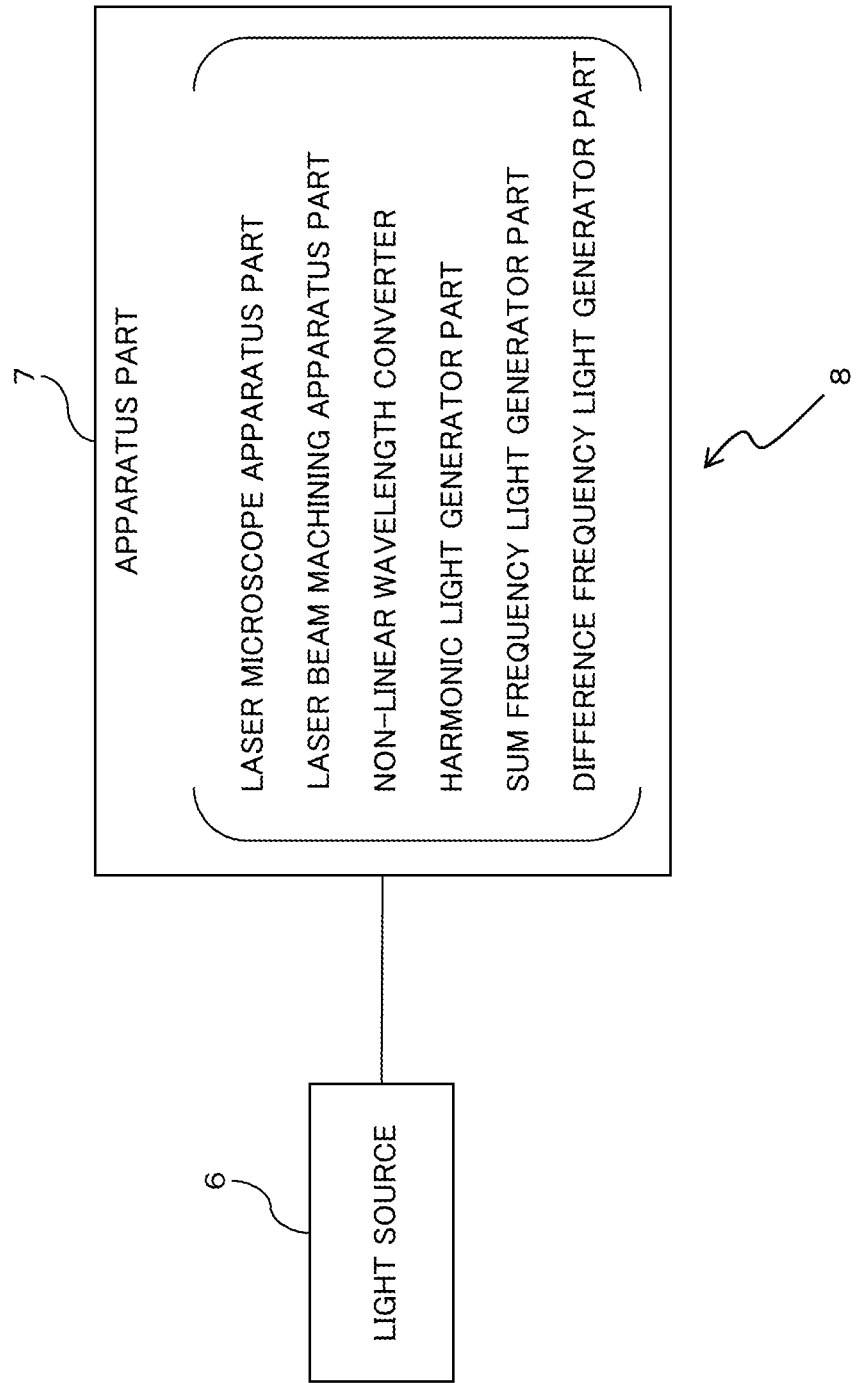
FIG. 14 is a block diagram schematically illustrating an example of an apparatus using non-linear effect which is provided with a semiconductor laser device according to an embodiment of the invention as a light source.

FIG. 14 schematically illustrates an example of an apparatus 8 using non-linear effect which is provided with a semiconductor laser device 6 according to an embodiment of the invention as a light source.

As illustrated in FIG. 14, the apparatus 8 using non-linear effect, for example, includes a light source 6 and an apparatus part 7 to which light is incident from the light source 6.

As described above, the apparatus 8 using non-linear effect, for example, is the laser microscope, the laser beam machining apparatus, the non-linear wavelength conversion apparatus, the harmonic light generation apparatus, the sum frequency light generation apparatus, the difference frequency light generation apparatus. In this case, as the apparatus part 7, for example, a laser microscope apparatus part, a laser beam machining apparatus part, a non-linear wavelength converter, a harmonic light generator part, a sum frequency light generator part, a difference frequency light generator part are exemplified. Herein, the laser microscope apparatus part means a part of the laser microscope from which the light source is removed, the laser beam machining apparatus part means a part of the laser beam machining apparatus part from which the light source is removed, and the non-linear wavelength converter means a part of the non-linear wavelength conversion apparatus from which the light source is removed. Further, the harmonic light generator part means a part of the harmonic light generation apparatus from which the light source is removed, the sum frequency light generator part means a part of the sum frequency light generation apparatus from which the light source is removed, and the difference frequency light generator part means a part of the difference frequency light generation apparatus from which the light source is removed.

Figure 15:
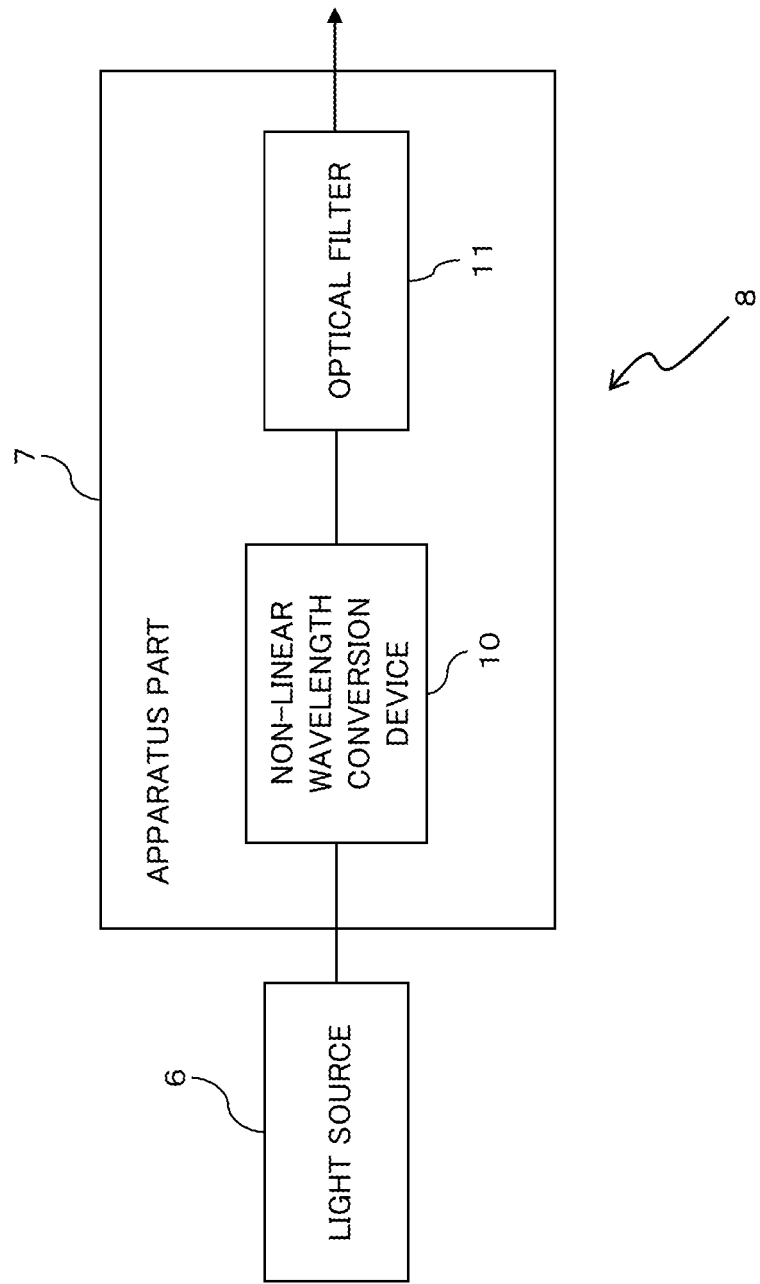
FIG. 15 is a block diagram illustrating a non-linear wavelength converter which is provided with a semiconductor laser device according to an embodiment of the invention as a light source.

FIG. 15 illustrates the non-linear wavelength conversion apparatus as an example of the apparatus 8 using non-linear effect.

As illustrated in FIG. 15, a non-linear wavelength converter 7 of the non-linear wavelength conversion apparatus 8, for example, includes a non-linear wavelength conversion device 10 and an optical filter 11.

The non-linear wavelength conversion device 10 is a device which converts a frequency of the incident light from the light source 6. The light of which the wavelength is converted by the non-linear wavelength conversion device 10 is appropriately filtered by the optical filter 11 to give a predetermined non-linear effect thereto.

For example, having the non-linear optical effect, the semiconductor laser device 6 of the invention can be used as a light source which generates light having peak power so as to generate an optical supercontinuum pulse (ultra-wide band optical pulse). The supercontinuum light is used for various applications such as optical communication, optoelectronic measurement, and biophotonics.

The low-average-power supercontinuum light does not pose a problem in that biological tissues are damaged, and thus it is very useful for a biomedical application.

Figure 16:
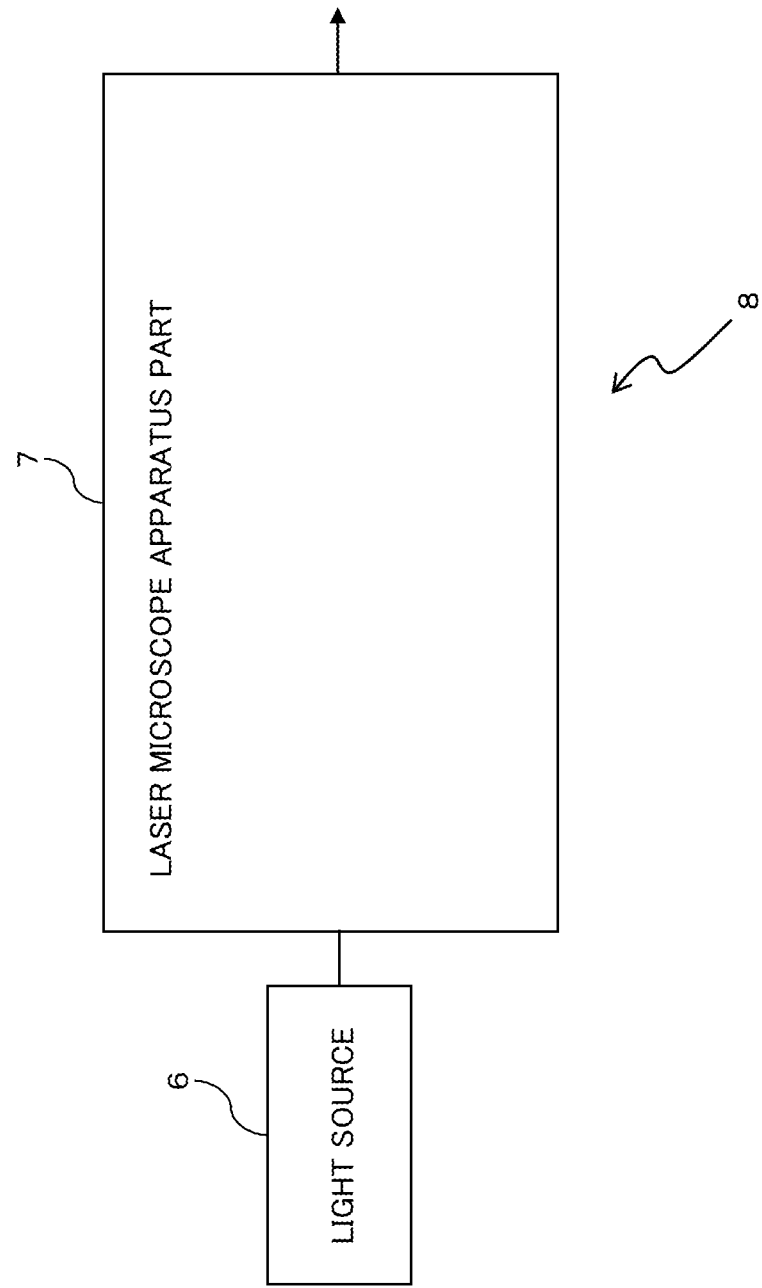
FIG. 16 is a block diagram illustrating a laser microscope which is provided with a semiconductor laser device according to an embodiment of the invention as a light source.

FIG. 16 illustrates a laser microscope as an example of the apparatus 8 using non-linear effect.

Figure 17:
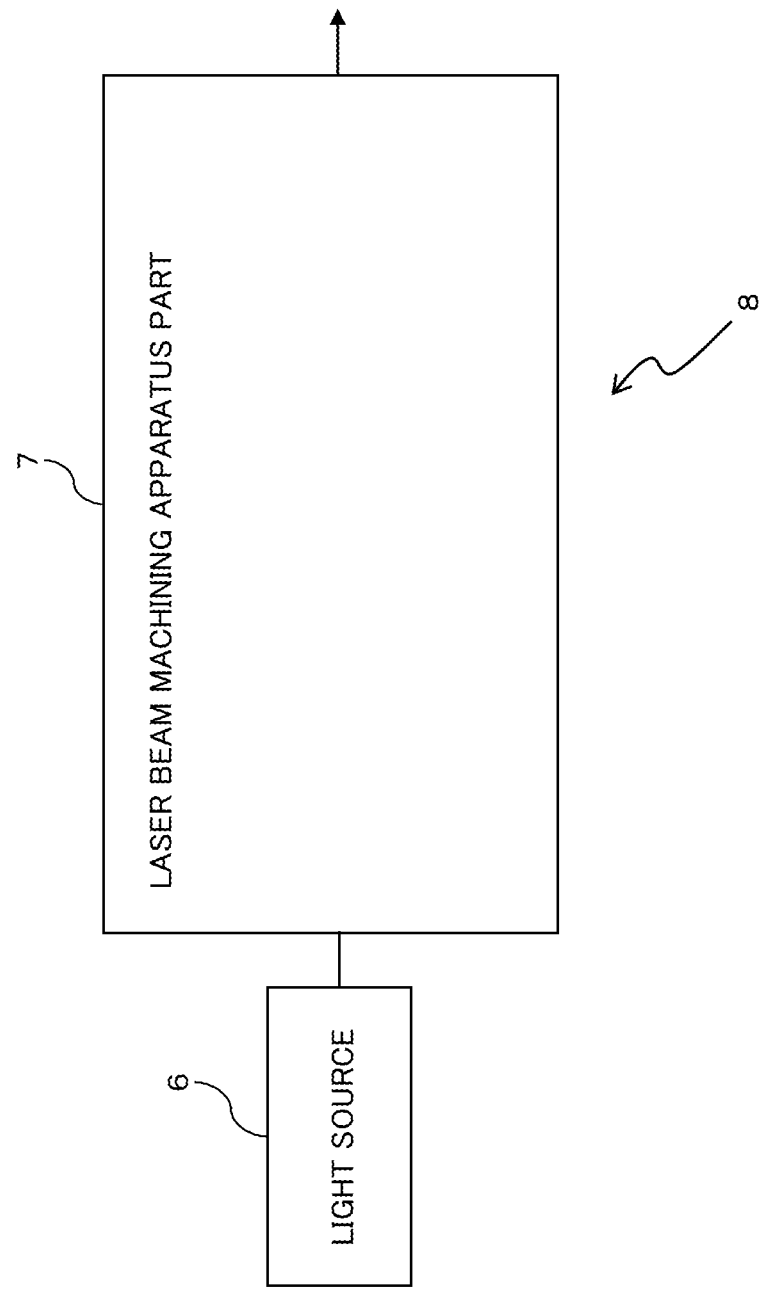
FIG. 17 is a block diagram illustrating a laser beam machining apparatus which is provided with a semiconductor laser device according to an embodiment of the invention as a light source.

FIG. 17 illustrates a laser beam machining apparatus as an example of the apparatus 8 using non-linear effect.

Figure 18:
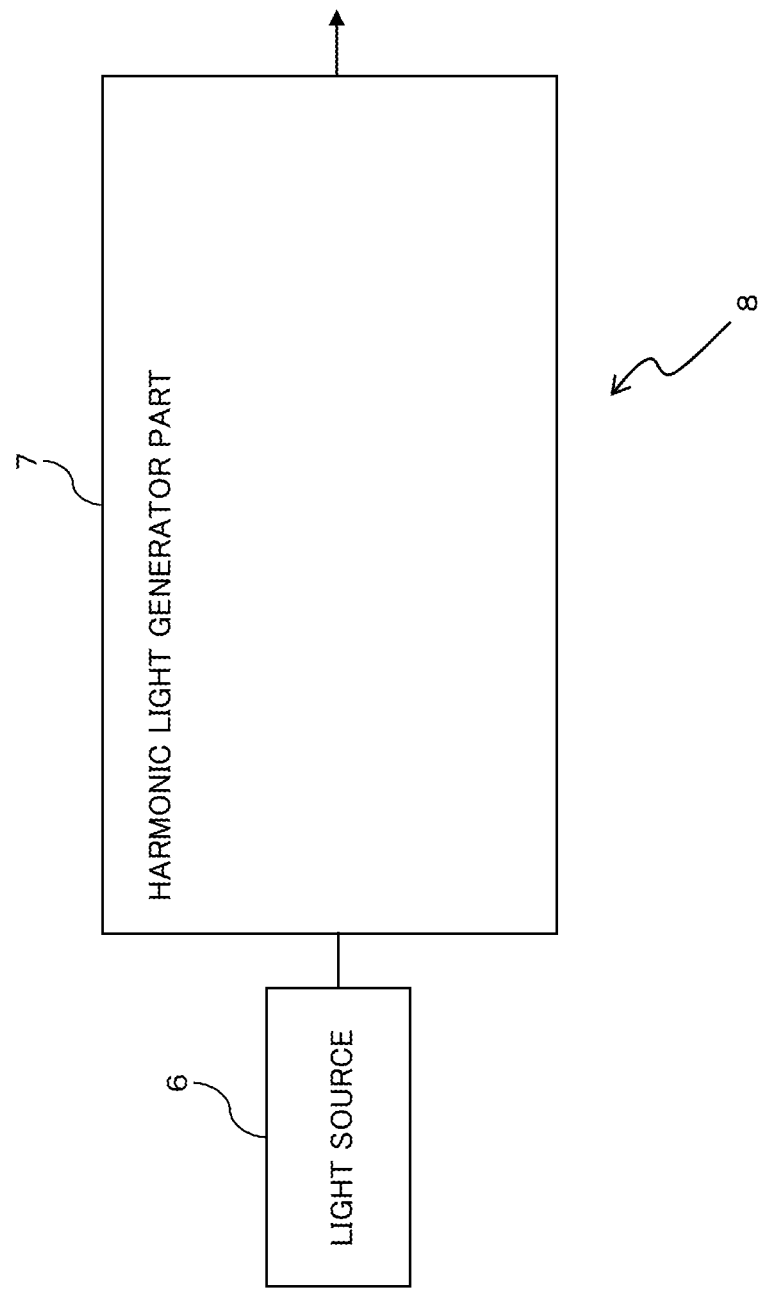
FIG. 18 is a block diagram illustrating a harmonic light generation apparatus which is provided with a semiconductor laser device according to an embodiment of the invention as a light source.

FIG. 18 illustrates a harmonic light generation apparatus as an example of the apparatus 8 using non-linear effect.

Figure 19:
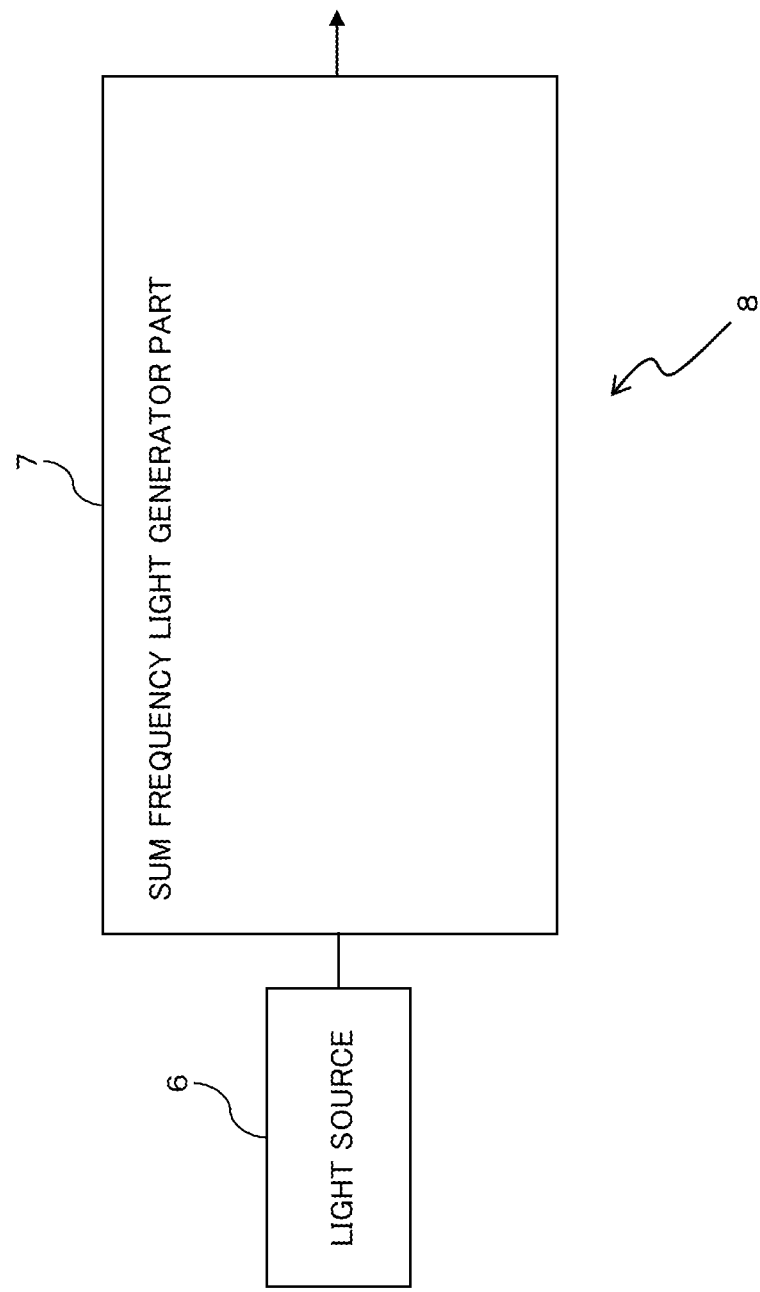
FIG. 19 is a block diagram illustrating a sum frequency light generation apparatus which is provided with a semiconductor laser device according to an embodiment of the invention as a light source.

FIG. 19 illustrates a sum frequency light generation apparatus as an example of the apparatus 8 using non-linear effect.

Figure 20:
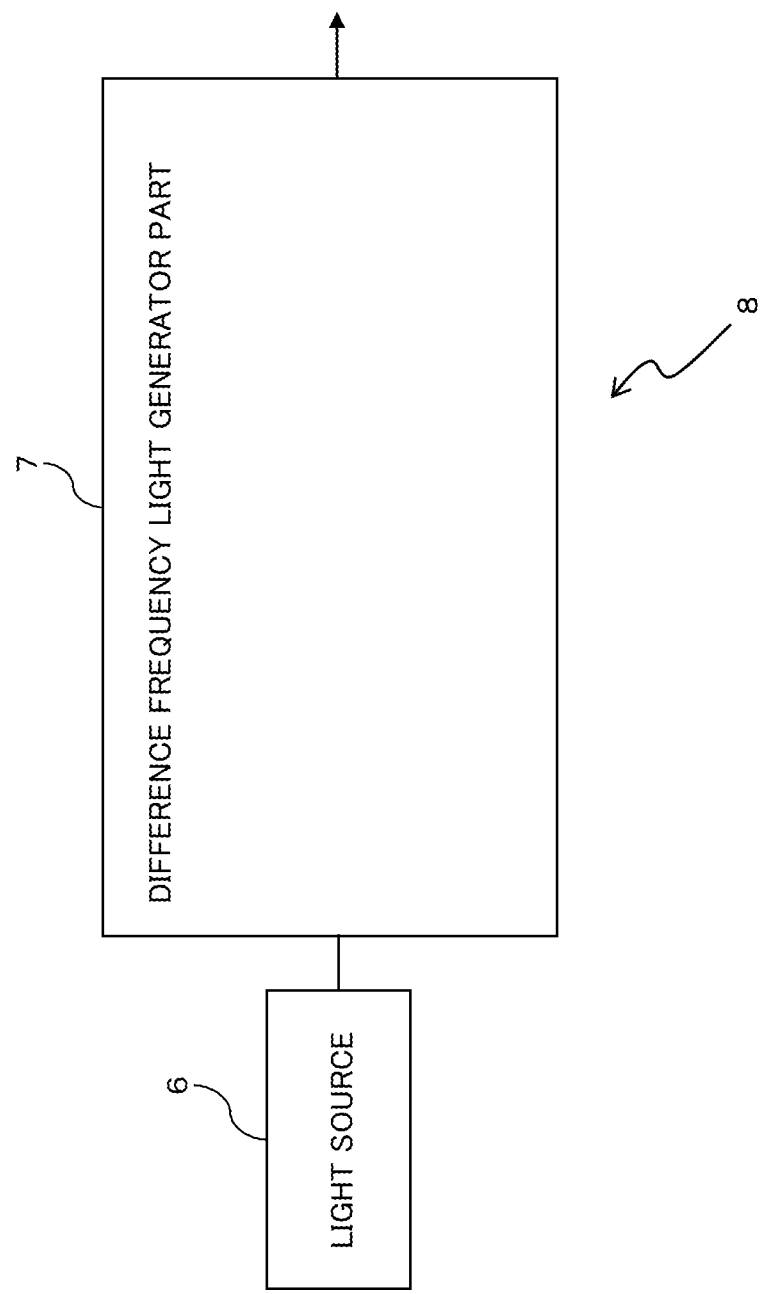
FIG. 20 is a block diagram illustrating a difference frequency light generation apparatus which is provided with a semiconductor laser device according to an embodiment of the invention as a light source.

FIG. 20 illustrates a difference frequency light generation apparatus as an example of the apparatus 8 using non-linear effect.

In this way, the semiconductor laser device 6 according to the invention generates the optical signal which includes the first pulse 30 and the following component 31 of the first pulse 30 separated from each other in time, and removes a signal in the wavelength bandwidth caused by at least the following portion in the wavelength bandwidth broadened by the chirping by the short pass filter 4 configured as a short pass filter which passes the short-wavelength component, so that it is possible to easily and reliably obtain a desired ultra-short optical pulse.

Further, the semiconductor laser device 6 according to the invention can easily and reliably generate the ultra-short pulse with a desired picosecond duration using the excitation pulse generator 2 which generates the electric pulse or the optical pulse with duration from the sub-nanosecond to several nanoseconds by appropriately combining the specifications of the semiconductor laser 1 and the excitation pulse generator 2. As the excitation pulse generator 2, a typical electric pulse generator or a typical optical pulse generator which is inexpensive and easily maintainable can be used. Therefore, since the excitation pulse generator 2 which is relatively inexpensive and easily maintainable can be used, it is possible to reduce the cost of the semiconductor laser device 6. Furthermore, since there is no need to provide an additional component such as a pulse compressor for compressing a pulse, the configuration can be simplified and easily maintained, and the number of components is reduced, so that it is possible to achieve the cost down of the semiconductor laser device 6.

Furthermore, there is also an advantage that a range of applicable operation conditions is widened by adjusting the specification (parameters).

[D. Others]

In addition, regardless of the above-mentioned embodiments, various modifications can be made in a scope not departing from the spirit of the embodiments.

For example, in the embodiments, the long-wavelength bandwidth component of the optical pulse output from the semiconductor laser 1 is removed to extract the short-wavelength bandwidth component, but the invention is not limited thereto. Giving attention to the short-wavelength bandwidth component of the optical signal, the short-wavelength bandwidth component may be extracted.

Further, in the embodiments, the short pass filter 4 removes at least the long-wavelength side component 21 (a portion which includes the long-wavelength side component 21 and the long-wavelength side of a skirt portion in the short-wavelength bandwidth component 20) caused by at least the following portion (a portion which includes the following component 31 and a part of the first pulse 30), but the short pass filter 4 may remove only the long-wavelength side component 21 caused by the following component 31. Therefore, it is possible to achieve the ultra-short pulse while keeping the intensity of the first pulse 30.

REFERENCE SIGNS LIST

1 Semiconductor laser
2 Excitation pulse generator
3 Semiconductor laser unit
4 Short pass filter (filter)
6 Semiconductor laser device (light source)
7 Apparatus part (laser microscope apparatus part, laser beam machining apparatus part, non-linear wavelength converter, harmonic light generator part, sum frequency light generator part, difference frequency light generator part)
8 Apparatus using non-linear effect (laser microscope, laser beam machining apparatus, non-linear wavelength conversion apparatus, harmonic light generation apparatus, sum frequency light generation apparatus, difference frequency light generation apparatus)
21 Long-wavelength bandwidth component (signal in wavelength bandwidth generated due to the following component)
30 First pulse
31 Following component of first pulse All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A semiconductor laser device comprising:
a semiconductor laser unit that performs a gain-switching operation using a relaxation oscillation mechanism to generate an optical pulse signal which includes a first pulse and a second component subsequent to the first pulse in a time domain;
a short pass filter that is an edge filter, is provided on an output side of the semiconductor laser unit, and processes an output signal from the semiconductor laser unit to obtain an ultra-short pulse, the short pass filter having a filter characteristic to remove a long-wavelength side component in a wavelength domain, which is broadened by chirping and corresponds to a portion including the second component and a part of the first pulse adjacent to the second component in the time domain, and a long-wavelength side of a skirt portion in a short-wavelength side component, so as to pass a short-wavelength side component that corresponds to a rising portion of the first pulse in the time domain; and
an optical amplifier that is provided on either one or both of input and output sides of the filter.

2. The semiconductor laser device according to claim 1, wherein
the semiconductor laser unit includes a single longitudinal mode oscillation semiconductor laser.

3. The semiconductor laser device according to claim 1, wherein
the semiconductor laser unit includes a distributed-feedback semiconductor laser.

4. The semiconductor laser device according to claim 1, wherein
the semiconductor laser unit includes the semiconductor laser and an excitation pulse generator which generates an excitation pulse with duration from sub-nanosecond to nanosecond to drive the semiconductor laser,
the semiconductor laser unit is configured to perform the gain-switching operation using the relaxation oscillation mechanism to generate the optical pulse signal which includes the first pulse and the second component, and
the short pass filter removes a signal in a wavelength bandwidth generated due to at least the second component and extracts a component caused by the first pulse to obtain an ultra-short pulse with picosecond duration.

5. The semiconductor laser device according to claim 1, wherein
the short pass filter is configured by a dielectric multilayer film filter as the edge filter.

6. The semiconductor laser device according to claim 5, wherein
the dielectric multilayer film filter has dependency on a wavelength in use due to a steep cutoff characteristic.

7. The semiconductor laser device according to claim 1, further comprising a temperature control device that performs temperature adjustment to control oscillation in the wavelength which is output from the semiconductor laser unit.

8. An apparatus using non-linear optical effect comprising:
a semiconductor laser device that includes
a semiconductor laser unit that performs a gain-switching operation using a relaxation oscillation mechanism to generate an optical pulse signal which includes a first pulse and a second component subsequent to the first pulse in a time domain;
a short pass filter that is an edge filter, is provided on an output side of the semiconductor laser unit, and processes an output from the semiconductor laser unit to obtain an ultra-short pulse, the short pass filter having a filter characteristic to remove a long-wavelength side component in a wavelength domain, which is broadened by chirping and corresponds to a portion including the second component and a part of the first pulse adjacent to the second component in the time domain, and a long-wavelength side of a skirt portion in a short-wavelength side component, so as to pass a short-wavelength side component that corresponds to a rising portion of the first pulse in the time domain;
an optical amplifier that is provided on either one or both of input and output sides of the filter, and
an apparatus part that includes the semiconductor laser device as a light source, and uses non-linear optical effect by an optical signal from the light source.

9. The apparatus using non-linear optical effect according to claim 8, wherein
the apparatus using non-linear optical effect uses the semiconductor laser device as a light source, and is any one of a laser microscope, a laser beam machining apparatus, a non-linear wavelength conversion apparatus, a harmonic light generation apparatus, a sum frequency light generation apparatus, and a difference frequency light generation apparatus.

10. A method of obtaining an ultra-short pulse comprising:
generating an optical pulse signal which includes a first pulse and a second component subsequent to the first pulse in a time domain, by a semiconductor laser unit that performs a gain-switching operation using a relaxation oscillation mechanism; and
obtaining an ultra-short pulse with a short pass filter that is an edge filter provided on an output side of the semiconductor laser unit and that processes an output signal from the semiconductor laser unit, wherein the obtaining the ultra short pulse includes providing the short pass filter with a filter characteristic to remove a long-wavelength side component in a wavelength domain, which is broadened by chirping and corresponds to a portion including the second component and a part of the first pulse adjacent to the second component in the time domain, and a long-wavelength side of a skirt portion in a short-wavelength side component, so as to pass a short-wavelength side component that corresponds to a rising portion of the first pulse in the time domain; and
providing an optical amplifier on either one or both of input and output sides of the filter.

11. The method according to claim 10, wherein the semiconductor laser unit includes a single longitudinal mode oscillation semiconductor laser.

12. The method according to claim 10, wherein the semiconductor laser unit includes a distributed-feedback semiconductor laser.

13. The method according to claim 10, wherein
the semiconductor laser unit includes the semiconductor laser and an excitation pulse generator which generates an excitation pulse with duration from sub-nanosecond to nanosecond to drive the semiconductor laser,
the semiconductor laser unit is configured to perform the gain-switching operation using the relaxation oscillation mechanism to generate the optical pulse signal which includes the first pulse and the second component, and
the short pass filter removes a signal in a wavelength bandwidth generated due to at least the second component and extracts a component caused by the first pulse to obtain an ultra-short pulse with picosecond duration.

14. The method according to claim 10, wherein
the short pass filter is configured by a dielectric multilayer film filter as the edge filter.

15. The method according to claim 14, wherein
the dielectric multilayer film filter has dependency on a wavelength in use due to a steep cutoff characteristic.

16. The method according to claim 10, further comprising performing temperature adjustment to control oscillation in the wavelength which is output from the semiconductor laser unit.

* * * * *